(12) United States Patent
Böck et al.

(10) Patent No.: US 7,371,650 B2
(45) Date of Patent: May 13, 2008

(54) METHOD FOR PRODUCING A TRANSISTOR STRUCTURE

(75) Inventors: Josef Böck, München (DE); Rudolf Lachner, Ingolstadt (DE); Thomas Meister, Taufkirchen (DE); Reinhard Stengl, Stadtbergen (DE); Herbert Schäfer, Höhenkirchen-Siegertsbrunn (DE); Martin Seck, München (DE)

(73) Assignee: Infineon Technologies AG, Munich (DE)

( * ) Notice: Subject to any disclaimer, the term of this patent is extended or adjusted under 35 U.S.C. 154(b) by 366 days.

(21) Appl. No.: 10/532,894

(22) PCT Filed: Oct. 24, 2003

(86) PCT No.: PCT/DE03/03552

§ 371 (c)(1),
(2), (4) Date: Apr. 27, 2005

(87) PCT Pub. No.: WO2004/040643

PCT Pub. Date: May 13, 2004

(65) Prior Publication Data

US 2006/0009002 A1    Jan. 12, 2006

(30) Foreign Application Priority Data

Oct. 28, 2002 (DE) ................................. 102 50 204

(51) Int. Cl.
*H01L 21/331* (2006.01)

(52) U.S. Cl. ..................... 438/357; 438/202; 438/234; 438/309; 438/338; 438/353; 257/E21.35; 257/E21.608; 257/E27.046; 257/E27.053; 257/E29.034

(58) Field of Classification Search ................ 438/202, 438/338, 234, 309, 353, 357; 257/E21.35, 257/E21.608, E27.046, E27.053, E29.034
See application file for complete search history.

(56) References Cited

U.S. PATENT DOCUMENTS 4,379,726 A    4/1983   Kamamaru et al.

(Continued)

FOREIGN PATENT DOCUMENTS

DE         26 33 569         7/1976

(Continued)

OTHER PUBLICATIONS

*Bipolar Transistor with Pedestal Subcollector Regions Self-Aligned Underneath Field Oxide Regions*, pp. 252-253, 700 IBM Technical Disclosure Bulletin, vol. 31, No. 3, Aug. 1988.

(Continued)

*Primary Examiner*—Michelle Estrada
(74) *Attorney, Agent, or Firm*—Brinks Hofer Gilson & Lione

(57) ABSTRACT

A method for fabricating a transistor structure with a first and a second bipolar transistor having different collector widths is presented. The method includes providing a semiconductor substrate, introducing a first buried layer of the first bipolar transistor and a second buried layer of the second bipolar transistor into the semiconductor substrate, and producing at least a first collector region having a first collector width on the first buried layer and a second collector region having a second collector width on the second buried layer. A first collector zone having a first thickness is produced on the second buried layer for production of the second collector width. A second collector zone having a second thickness is produced on the first collector zone. At least one insulation region is produced that isolates at least the collector regions from one another.

7 Claims, 7 Drawing Sheets

U.S. PATENT DOCUMENTS

Figure 2A:
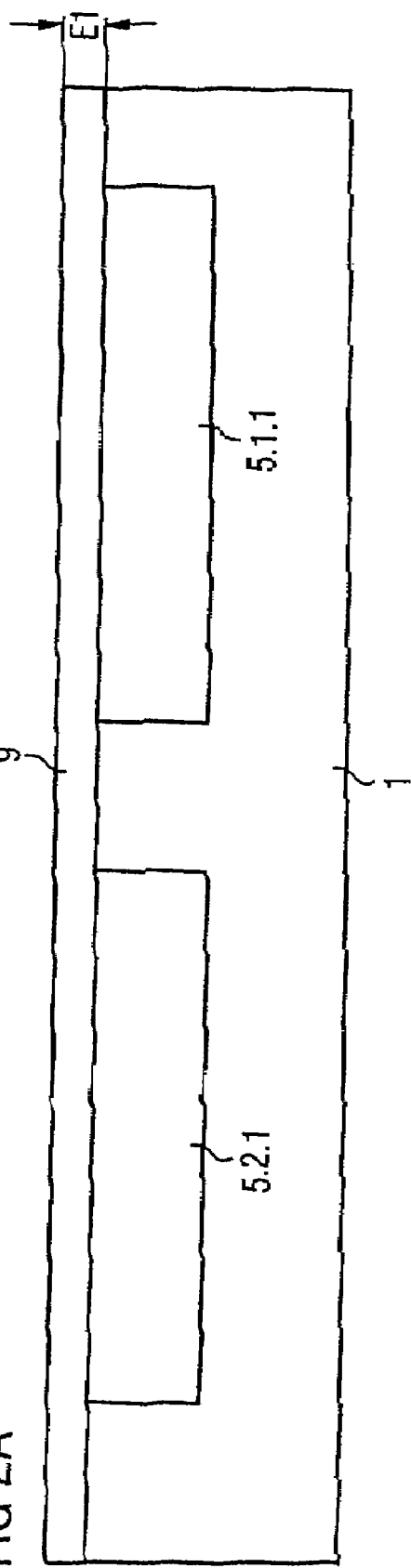

| | | | |
|---|---|---|---|
| 4,882,294 | A | 11/1989 | Christenson |
| 2001/0045619 | A1 | 11/2001 | Dekker et al. |
| 2002/0079554 | A1 | 6/2002 | Okawa et al. |

FOREIGN PATENT DOCUMENTS

| | | | | |
|---|---|---|---|---|
| DE | 100 44 838 A1 | | | 9/2000 |
| GB | 1 480 050 | | | 7/1977 |
| JP | 7323812 B | * | | 7/1973 |
| JP | 58009354 | | | 1/1983 |
| JP | 58159346 | | | 9/1983 |
| JP | 62154779 | | | 7/1987 |
| JP | 2003174034 A | * | | 6/2003 |
| WO | WO 97/17726 | | | 5/1997 |

OTHER PUBLICATIONS

M. Racanelli, K. Schuegraf, A. Kalburge, A. Kar-Ray, B. Shen, C. Hu, D. Chapek, D. Howard, D. Quon, F. Wang, G. U'ren, L. Lao, J. Zheng, J. Zhang, K. Bell, K. Yin, P. Joshi, S. Akhtar, S. Vo, T. Lee, W. Shi and P. Kempf, *Ultra High Speed SiGe NPN for Advanced BiCMOS Technology*, Silicon RF Platform Technologies, Conexant Systems, Inc.

International Search Report from corresponding PCT patent application No. PCT/DE03/03552.

Examination Report from corresponding PCT patent application No. PCT/DE03/03552.

* cited by examiner

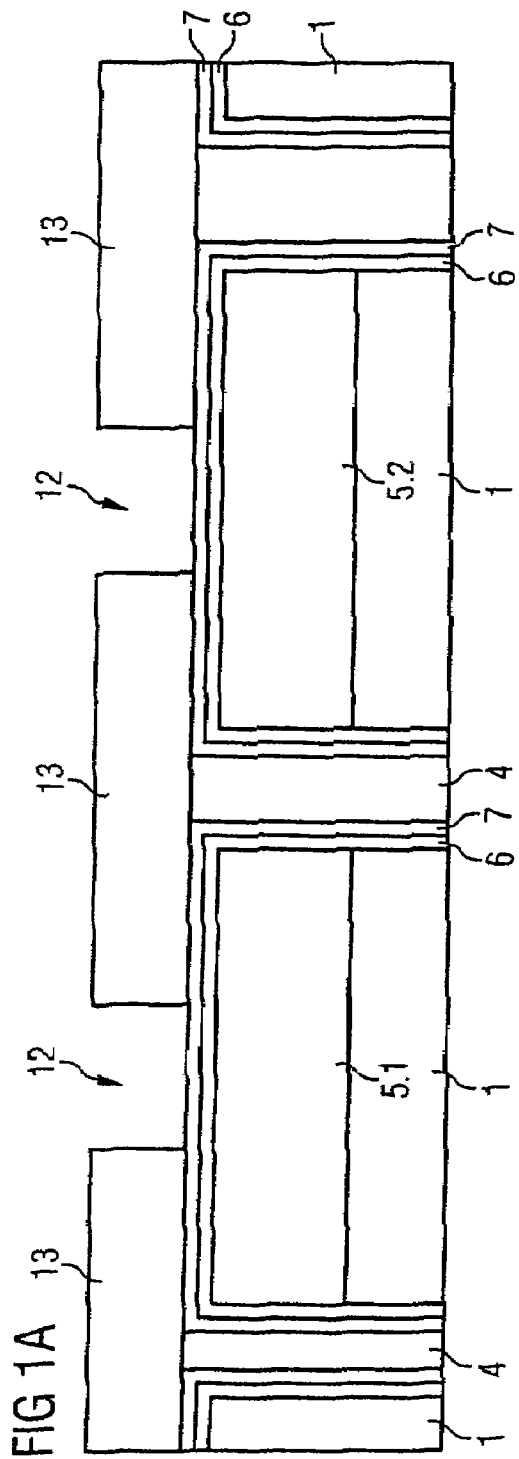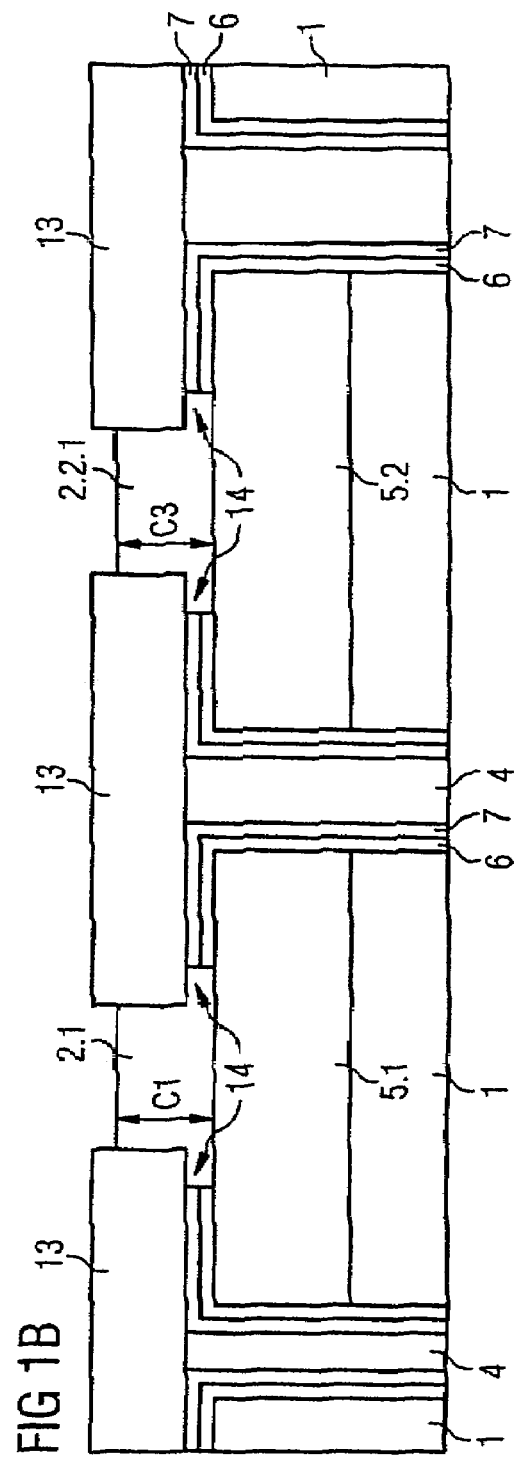

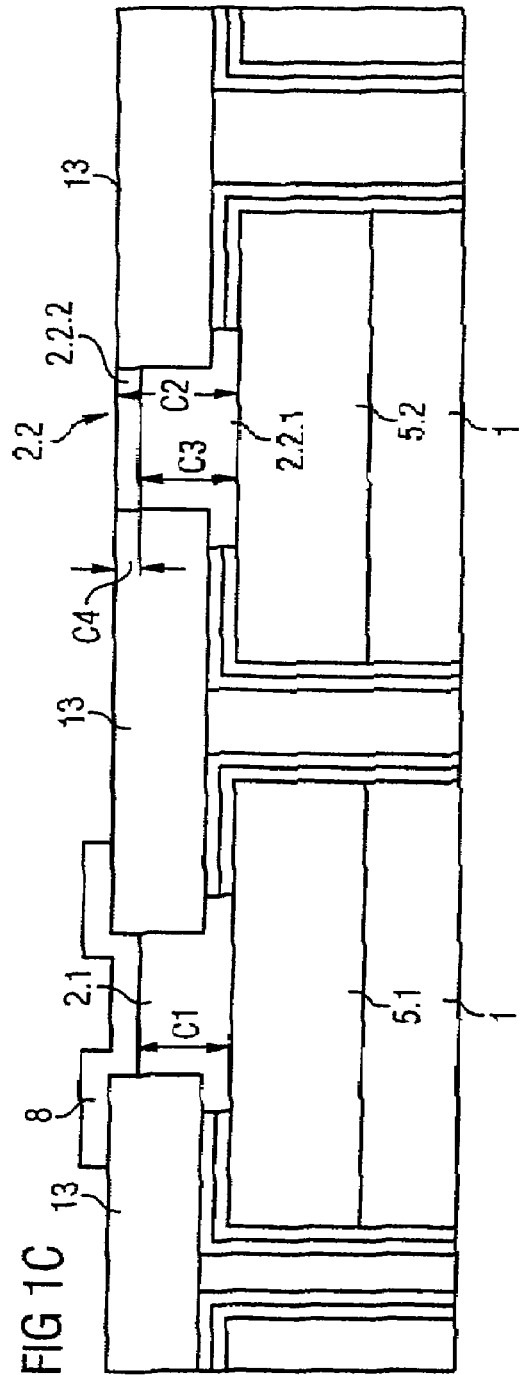
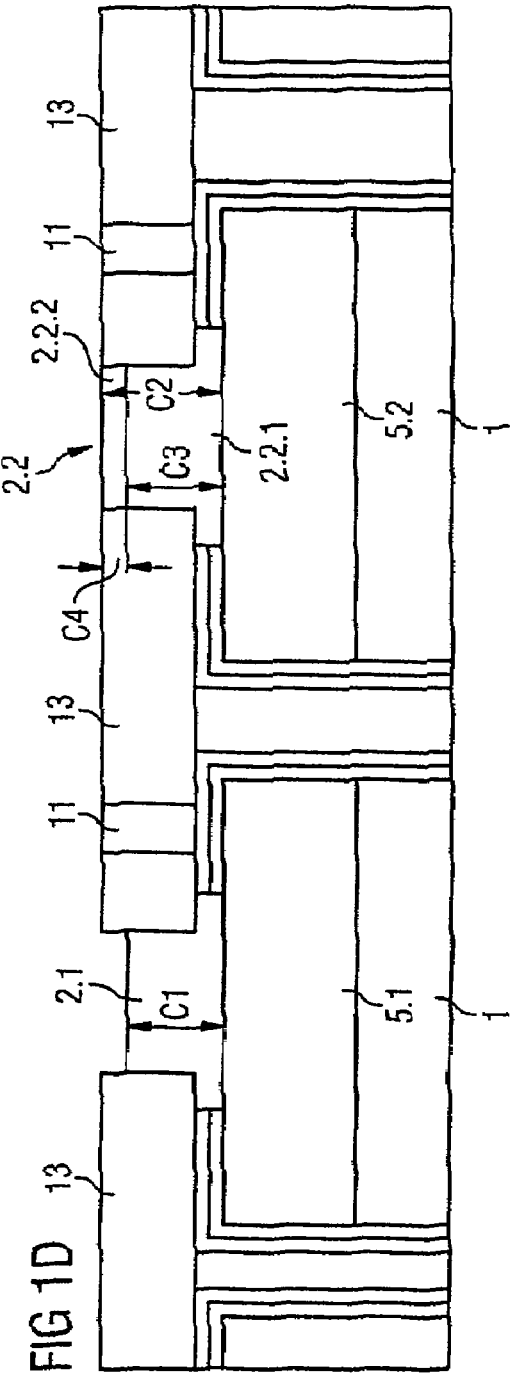

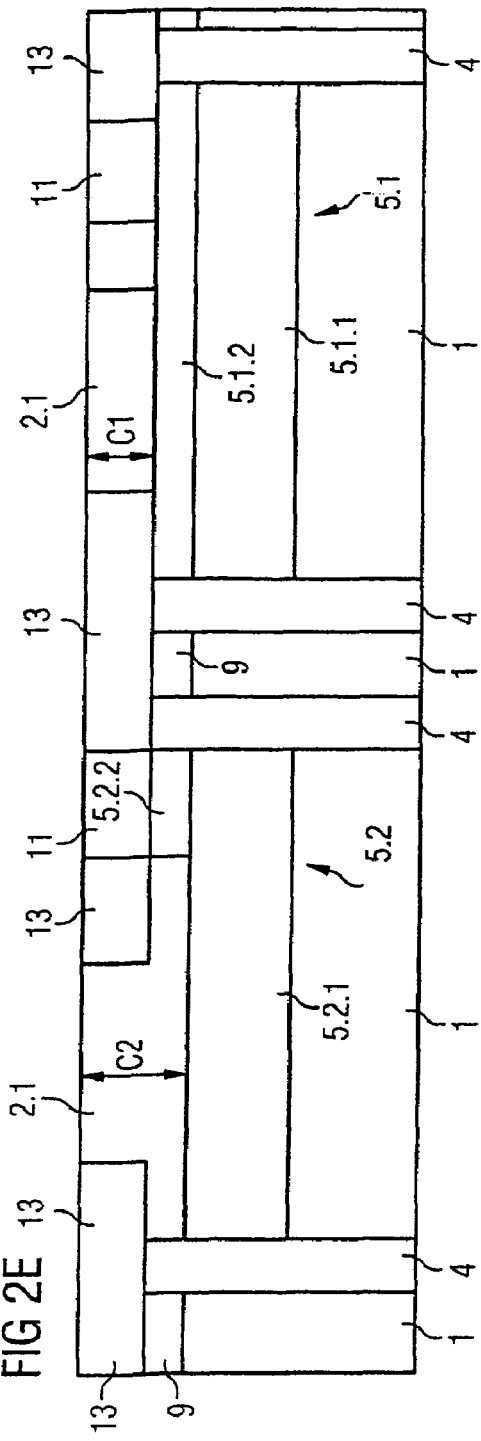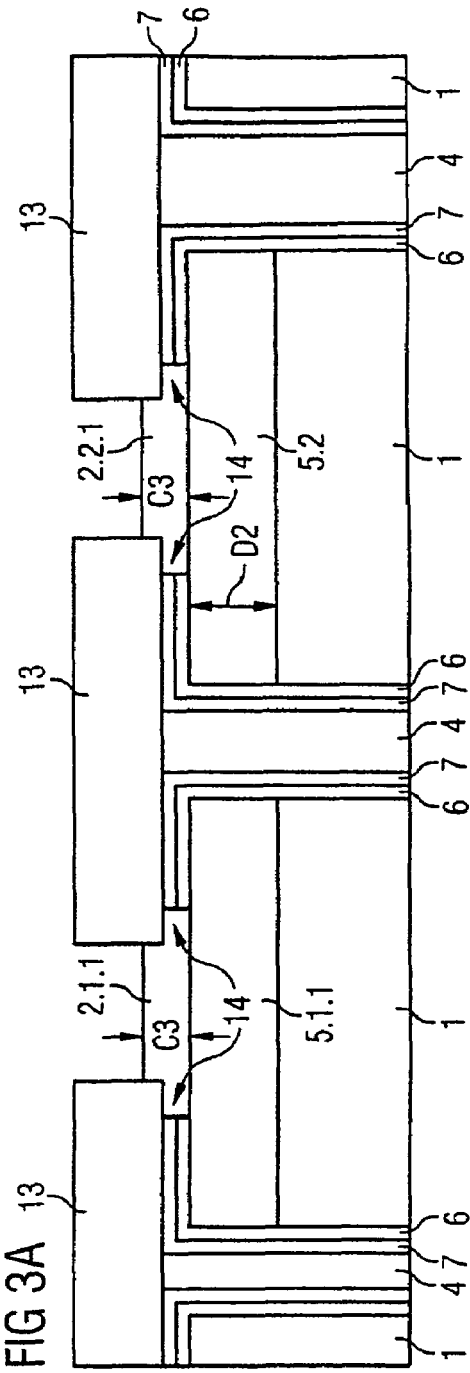

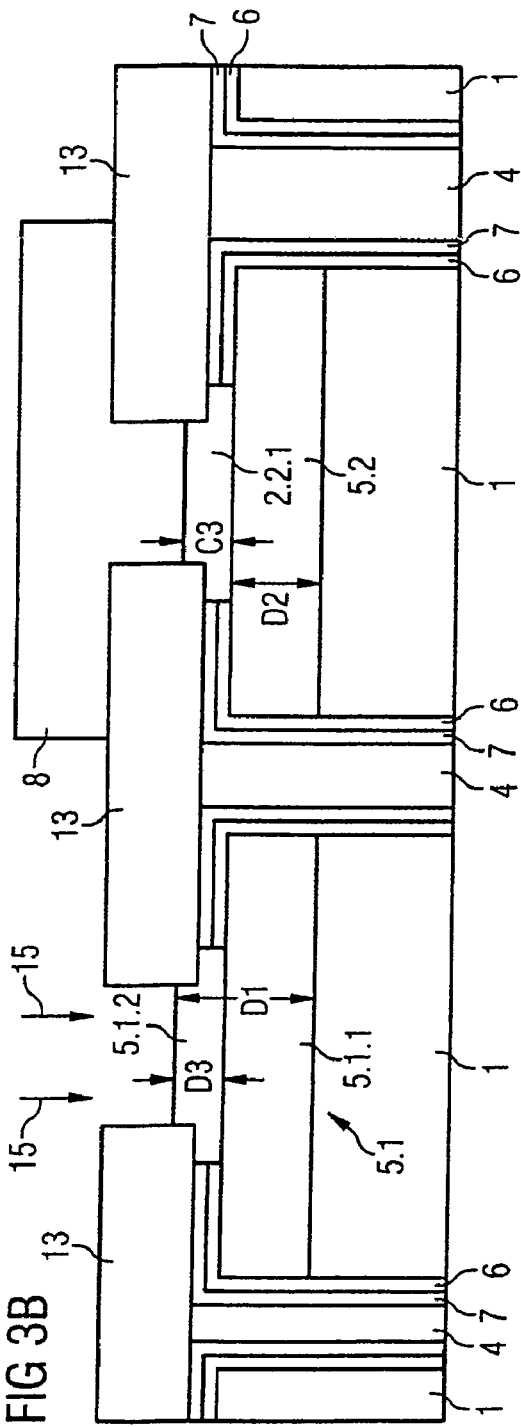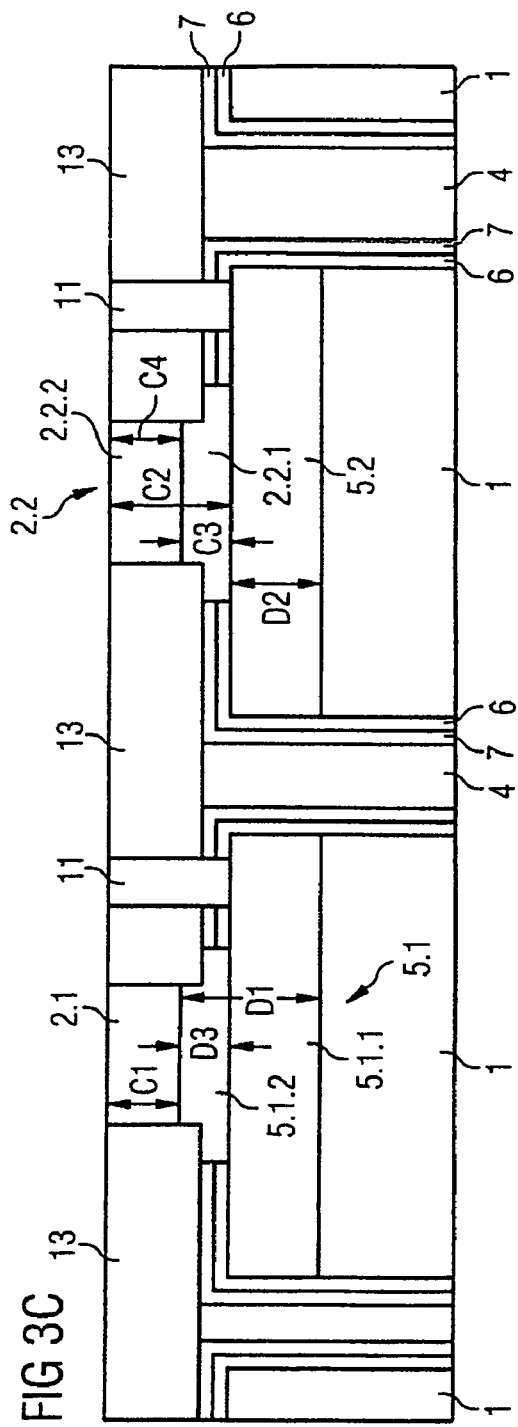

METHOD FOR PRODUCING A TRANSISTOR STRUCTURE

This application is the national stage application of international application number PCT/DE03/003552, filed on Oct. 24, 2003, which claims the benefit of priority to German Patent Application 102 50 204.8, filed on Oct. 28, 2002, incorporated herein by reference.

The present invention relates to a method for fabricating a transistor structure, comprising at least a first and a second bipolar transistor having different collector widths. Such a method is known from DE 100 44 838 C2 for example.

In bipolar transistors, the collector is usually terminated by a highly doped buried layer. The buried layer is produced by subjecting the substrate to an ion implantation at the desired location. Afterward, a lightly doped epitaxial layer is applied and the wells for base, emitter and collector are produced. A possible process sequence is described for example in the textbook "Technologie hochintegrierter Schaltungen" ["Technology of large scale integrated circuits"] by D. Widmann, H. Mader, H. Friedrich, Springer Verlag, 2nd edition, Table 8.13, pp. 326-334.

For integrated high-frequency circuits in the GHz range, it is favorable to integrate both high-voltage transistors (HV transistor) having a high breakdown voltage and high-frequency transistors (HF transistors) having a short collector transit time and hence a high limiting frequency $F_t$. On account of the fabrication methods known heretofore, it is necessary to find a compromise with regard to the properties in the integration of bipolar transistors having different limiting frequencies and bipolar transistors having different breakdown voltages in high-frequency circuits. This means that the performance of such a high-frequency circuit cannot be utilized optimally.

Such integration has been realized hitherto e.g. by means of the collector region having a dopant concentration of differing magnitude. The lower the doping, the higher the collector-base breakdown voltage. However, as a result of this the collector transit time becomes longer and hence the limiting frequency $F_t$ becomes lower. The higher the doping, the shorter the collector transit time but the smaller the collector-base breakdown voltage of the transistor.

M. Racanelli et al. "Ultra High Speed SiGe NPN for Advanced BiCMOS Technology", 2001 IEEE discloses scaling the doping of a collector region of a transistor in such a way that the dopant concentration within the collector region has a gradient. Although this solution makes it possible to increase the breakdown voltage of HF transistors, it still represents a compromise.

In addition to the dopant concentration, the dimensioning of the collector width also determines the properties of a bipolar transistor. The term collector width denotes that region of the epitaxial layer which is located between the base well located in the epitaxial layer and the buried layer. HF transistors which are to be optimized toward high limiting frequencies must have a small collector width and HV transistors which are optimized toward high breakdown voltages must have a large collector width.

DE 100 44 838 C2 describes a semiconductor component and also a method for fabricating it in which bipolar components having different collector widths are realized. In this case, an additional substance is introduced into a buried layer of a bipolar component, which additional substance influences the diffusion of a dopant of the buried layer and hence the collector width of said bipolar component. However, this method does not result in a sharp junction between the differently doped buried layers and collectors. Consequently, the collector width cannot be established exactly and with a sharp profile, but rather exhibits a "blurred" profile with a shallow gradient.

Accordingly, it is an object of the present invention to specify an optimized method for fabricating a transistor structure in which collector regions having different collector widths can be formed, the collector regions having a sharp boundary with respect to the buried layers.

According to the invention, the object is achieved by means of a method of the type mentioned in the introduction in which there are produced at least a first collector region having a first collector width C1 on a first buried layer and a second collector region having a second collector width C2 on a second buried layer, in which case, for the production of the second collector width C2, a first collector zone having a first thickness C3 is produced on the second buried layer and a second collector zone having a second thickness C4 is produced on the first collector zone, and at least one insulation region is produced, which isolates at least the collector regions from one another.

What is achieved as a result of this is that the two bipolar transistors of the transistor structure have a different collector width, and the collector regions have a sharp or abrupt junction with a steep gradient with respect to the adjacent regions, such as the buried layers. The collector width C1 of the first bipolar transistor preferably corresponds to the first thickness C3 of the second collector region. The collector width C2 of the second bipolar transistor is composed of the thicknesses C3 and C4 of the collector zones of the second collector region. Accordingly, the thicker the second thickness C4, the greater also the difference between the collector widths of the two bipolar transistors.

The invention is based on the insight that a sharp boundary or an abrupt junction between the lightly doped collector and the highly doped buried layer significantly improves the behavior of a transistor since an abrupt profile with a steep gradient, with a sheet resistance remaining the same, has lower fringing capacitances than a profile with a shallow gradient. Equally, the method according to the invention improves the high-current behavior of the transistor since there is no unnecessary dopant in that part of the collector which is flooded with charge carriers and, by the same token, the conduction of the buried layer is lowered.

According to the invention, the method of the type mentioned in the introduction is developed further to the effect that at least a first zone of a first buried layer of a first conductivity type of the first bipolar transistor and a first zone of a second buried layer of a first or a second conductivity type of the second bipolar transistor are introduced into the semiconductor substrate, a first epitaxial layer is produced, which covers, over the whole area, at least the first zone of the buried layers, at least a second zone of the first conductivity type is produced within the first epitaxial layer, the second zone adjoining the first zone of the first buried layer, a second epitaxial layer is produced, which covers, over the whole area, at least the first epitaxial layer and the second zone of the first buried layer, at least one insulation region is produced, which isolates at least the collector regions from one another, the second zone of the first buried layer adjoining the first collector region and the first zone of the second buried layer adjoining the second collector region.

Buried layers having different thicknesses are thereby produced, the thickness of the first buried layer being composed of a first zone, which is introduced into the semiconductor substrate, and a second zone, which is introduced into the first epitaxial layer. The second buried layer and the first zone of the first buried layer preferably have the same thickness in this case. The thicknesses of the first and second buried layers thus differ by the thickness of the second zone of the second buried layer. Since the collector width, as mentioned in the introduction, depends on the thickness of the epitaxial layer, minus the buried layer extending into the epitaxial layer, the collector widths C1 and C2 can be varied in a simple manner and, unlike in embodiments known hitherto, nevertheless have a sharp junction between the highly doped buried layers and the lightly doped collector regions.

The inventors furthermore propose developing the method of the type mentioned in the introduction further in such a way that at least a first zone of a first buried layer of a first conductivity type of the first bipolar transistor and a second buried layer of a first or a second conductivity type of the second bipolar transistor are introduced into the semiconductor substrate, at least a first collector zone of the first bipolar transistor and a first collector zone of the second bipolar transistor are produced, the first collector zone of the first bipolar transistor adjoining the first zone and the first collector zone of the second bipolar transistor adjoining the second buried layer, the first collector zone is formed as first conductivity type, a second collector zone is produced on the first collector zone of the second bipolar transistor and a second collector zone is produced on the first collector zone of the first bipolar transistor, and at least one insulation region is produced, which isolates at least the collector zones from one another.

This too means that it is possible, in a simple manner, for collector regions to be fabricated which have both different thicknesses and sharp profiles with a steep gradient with respect to the adjacent buried layers and, consequently, a transistor structure is formed which comprises both the properties of an HV transistor and those of an HF transistor.

A development of the methods according to the invention provides for the third collector zone to be deposited.

In a preferred development of the methods according to the invention, the third collector zone is deposited epitaxially. As a result of this, the collector zone is grown with the fewest possible crystal defects, which is very important for the functional properties of a bipolar transistor.

Another refinement provides for an insulating layer (SOI layer, SOI—Silicon On Insulator) to be provided between the buried layers and the semiconductor substrate. The collector regions are thereby electrically insulated and capacitively decoupled from the substrate without the need for any additional insulation.

Typically, the insulation region which isolates at least the collector regions from one another is isolated from one another with the aid of shallow trench isolation technology (STI technology). The insulation region may be filled with an electrically insulating material, such as a CVD oxide (CVD=Chemical Vapor Deposition), for example. Preferably, the two laterally adjacent highly doped buried layers of two bipolar transistors are thereby electrically insulated from one another. Said insulation region may be embodied for example as a full trench or as a deep trench.

A full trench is a trench, for example between components of a chip, in which the silicon is etched or interrupted as far as the buried layers, so that current paths between the components are completely interrupted. A full trench can isolate relatively large transistor regions from one another, as is also described in an article by S. Maeda, "Impact of 0.18 μm SOI CMOS Technology using Hybrid Trench Isolation with High Resistivity Substrate on Embedded RF/Analog Applications", 2000 Symp. on VLSI Technology—Digest of Technical Papers (CAT. No. 00CH37104), pages 154 to 155, hereby incorporated by reference.

A deep trench is described for example in the article "An SOI-Based High Performance Self-Aligned Bipolar Technology Featuring 20 ps Gate-Delay and a 8.6 fJ Power Delay Product" by E. Bertagnolli et al., 1993, Symp. on VLSI Technology, Digest of Technical Papers (CAT. No. 93CH3303-5), pages 63 to 64, hereby incorporated by reference. In contrast to the full trench, the deep trench is not wide enough to be able to integrate the entire dimensions of passive components above it. Rather, the deep trench serves for dielectric component isolation.

Figure 4:
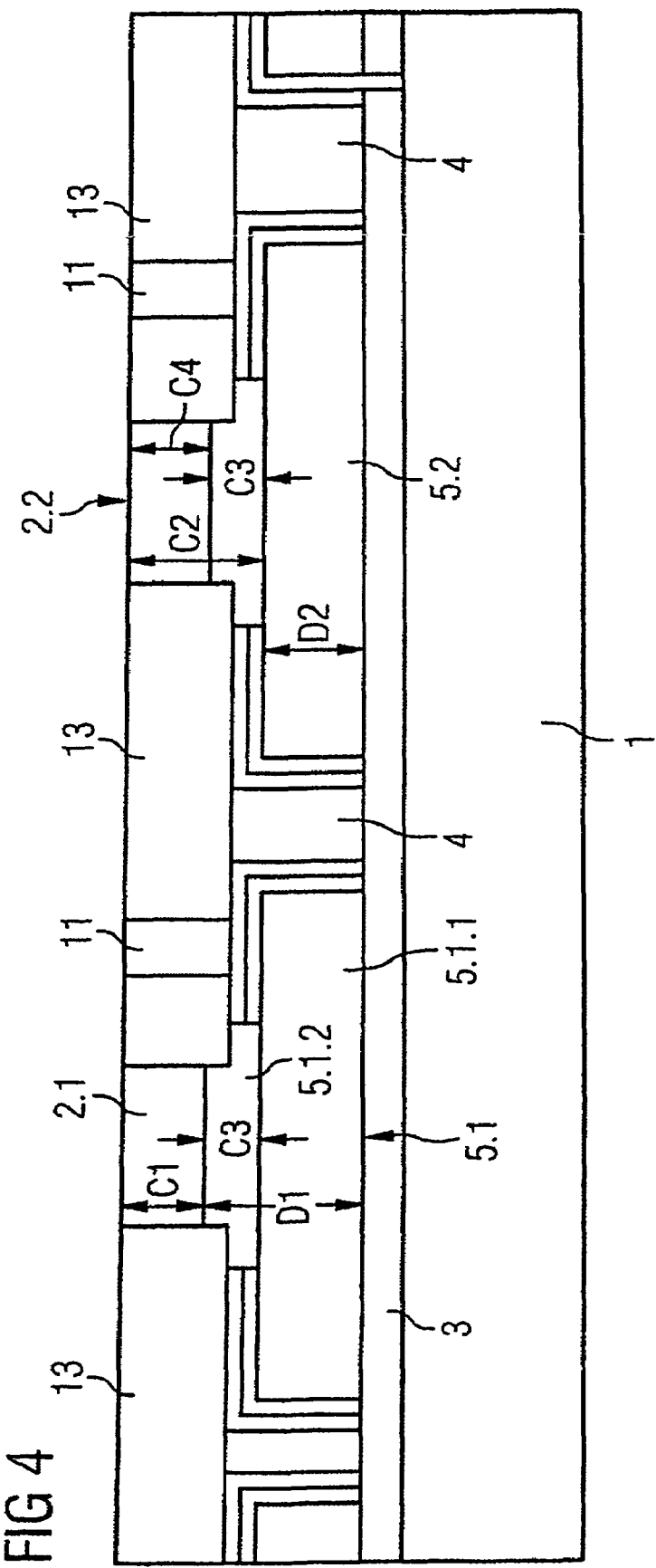

Preferred exemplary embodiments of the present invention are explained in detail below with reference to the accompanying drawings, in which FIGS. 1a to 1d show a diagrammatic cross-sectional view of a first method according to the invention for producing a transistor structure according to the invention with two collector regions having a different collector width by means of selective epitaxy, FIGS. 2a to 2e show a diagrammatic cross-sectional view of a second method according to the invention for producing a transistor structure with two collector regions having a different collector width by means of whole-area epitaxy, FIGS. 3a to 3c show a diagrammatic cross-sectional view of a third method according to the invention for producing a transistor structure with two collector regions having a different collector width, FIG. 4 shows a diagrammatic cross-sectional view of an alternative configuration for producing a transistor structure with two collector regions having a different collector width with an SOI structure.

The first method according to the invention for producing a transistor structure according to the invention with two collector regions having a different collector width which is described below with reference to FIGS. 1a to 1d is performed by means of selective epitaxy.

In FIG. 1a, the, for example $n^+$-doped, buried layers 5.1 and 5.2 have already been introduced into the semiconductor substrate 1 and insulated from one another by insulation regions 4, here realized as deep trenches 4. The semiconductor substrate 1 comprises e.g. monocrystalline silicon which is p-doped.

A first auxiliary layer 6 and a second auxiliary layer 7 are furthermore provided, which isolate the insulation region 4 from the semiconductor substrate 1 and the buried layers 5.1 and 5.2. In this case, the second auxiliary layer 7 adjoins the insulation region 4 and the first auxiliary layer 6 adjoins the second auxiliary layer 7 and also the semiconductor substrate 1 and the buried layers 5.1 and 5.2.

The second auxiliary layer 7 preferably comprises a material which is resistant to oxidation and can be etched selectively with respect to oxide, such as silicon nitride $Si_3N_4$, for example. This makes it possible to avoid sidewall defects, that is to say crystal defects which arise at the interface between a dielectric material and silicon during the epitaxial growth of the silicon. In another variant, the second auxiliary layer 7 may be formed from polysilicon. The thickness of said second auxiliary layer 7 lies in the range of between 3 nm and 60 nm. One advantage of this thin nitride lining is that it protects the wall of the insulation region 4, which is filled with CVD oxide, for example, against oxidations and thus prevents defect formations.

The first auxiliary layer 6 preferably comprises a material which can be etched selectively with respect to the layer 7 and avoids large mechanical stresses on the semiconductor substrate 1, such as an oxide, for example. Furthermore, the auxiliary layer 6, up to the epitaxy, can protect the sensitive silicon surface of the buried layers 5.1 and 5.2 against oxidation.

The openings 12 are etched into an STI oxide layer 13 down to the second auxiliary layer 7, which STI oxide layer preferably covers the whole area of the semiconductor substrate 1 with the auxiliary layers 6 and 7 situated thereon. As is known from EP 0 600 276 B1, hereby incorporated by reference, the etching may be effected by anisotropic dry etching which stops selectively on silicon nitride, and thus on the second auxiliary layer 7.

In the subsequent method step in accordance with FIG. 1b, a lateral undercut 14 of the auxiliary layers 6 and 7 is effected. The undercut 14 is described in more detail in EP 0 600 276 B1, hereby incorporated by reference. Since sidewall defects form proceeding from the interfaces between the auxiliary layers 6 and 7 and the surface of the buried layers 5.1 and 5.2 and grow up at an angle of about 52° along (111) crystal faces, that is to say for example along the sidewall of the STI oxide layer, this growth of the sidewall defects can be interrupted by the overhang formed by the undercuts 14 of the STI oxide layer 13.

Afterward, a first collector region 2.1 having a thickness C1 and also a collector zone 2.2.1 having a thickness C3 are deposited epitaxially, the first collector region 2.1 adjoining the first buried layer 5.1 and the collector zone 2.2.1 adjoining the second buried layer 5.2. In this case, the collector zone 2.2.1 is provided for the second collector region of a second bipolar transistor. The thicknesses C1 and C3 of the collector region 2.1 and of the collector zone 2.2.1 are approximately identical and are preferably between 50 nm and 300 nm.

After the first collector region 2.1 has been covered with a masking layer 8, a further collector zone 2.2.2 is applied epitaxially on the collector zone 2.2.1 in FIG. 1c. Said collector zone 2.2.2 preferably has a thickness C4 of between 100 nm and 200 nm. The collector width C2 of the second collector region 2.2, composed of the collector zones 2.2.1 and 2.2.2, thus lies in the range of between 150 nm and 500 nm.

In the present example, the second collector region 2.2 terminates at approximately the same level with the surface of the STI oxide layer 13.

Typically, the collector width C1 of the first collector region 2.1 and the collector width C2 of the second collector region 2.2 are in a ratio of between 0.05 and 0.9 to one another. Typical values are 100 nm for the collector width C1 and 250 nm for the collector width C2. The different collector widths C1 and C2 of the two collector regions 2.1 and 2.2 on the same semiconductor substrate 1 have the effect of optimizing the properties both of an HF transistor and of an HV transistor.

If the intention is to obtain even greater differences between the collector widths of the first and second collector regions 2.1 and 2.2, then, in the method step of FIG. 1b, the collector width C1 and the thickness C3 are kept relatively low and, in the subsequent method step of FIG. 1c, the deposition of the collector zone 2.2.2 with a second thickness C4 is repeated appropriately often.

In the transistor structure of FIG. 1d, the masking layer above the collector region 2.1 has been removed and collector terminal regions 11 have been introduced. After filling with tungsten, for example, the collectors can be routed out electrically to the surface, thereby enabling the transistor structure to be integrated into an integrated circuit.

The method according to the invention for fabricating a transistor structure for two bipolar transistors with the aid of selective epitaxy which has been described with reference to FIGS. 1a to 1d is particularly simple. The various collector regions are deposited in respectively successive epitaxy steps with the required thickness in the STI oxide layer 13, the already completed collector region 2.1 being covered by a masking layer 8 in order to prevent a further epitaxial deposition. The regions in the STI oxide layer 13 which are required for an epitaxial deposition are thus opened in each case only for the corresponding epitaxy step.

It is also possible with the aid of whole-area epitaxy to realize collector regions $2.x$ having different collector widths and sharp junctions with respect to the highly doped buried layers, as explained below with reference to FIGS. 2a to 2e. In this case, the collector regions $2.x$ terminate toward the top in planar fashion at the same level with the surface of the STI oxide layer 13, the thicknesses D1 and D2 of the buried layers 5.1 and 5.2 being varied. This planar termination is particularly advantageous since planar surfaces are required for subsequent photosteps (not described here), with feature sizes of less than 0.35 µm.

In accordance with FIG. 2a, an epitaxial layer 9 having a thickness E1 is deposited over the whole area of the semiconductor substrate 1, into which a first zone 5.1.1 of a first buried layer and a further first zone 5.2.1 of a second buried layer have already been implanted. The first zones 5.1.1 and 5.2.1 are preferably $n^+$-doped.

Figure 2B:
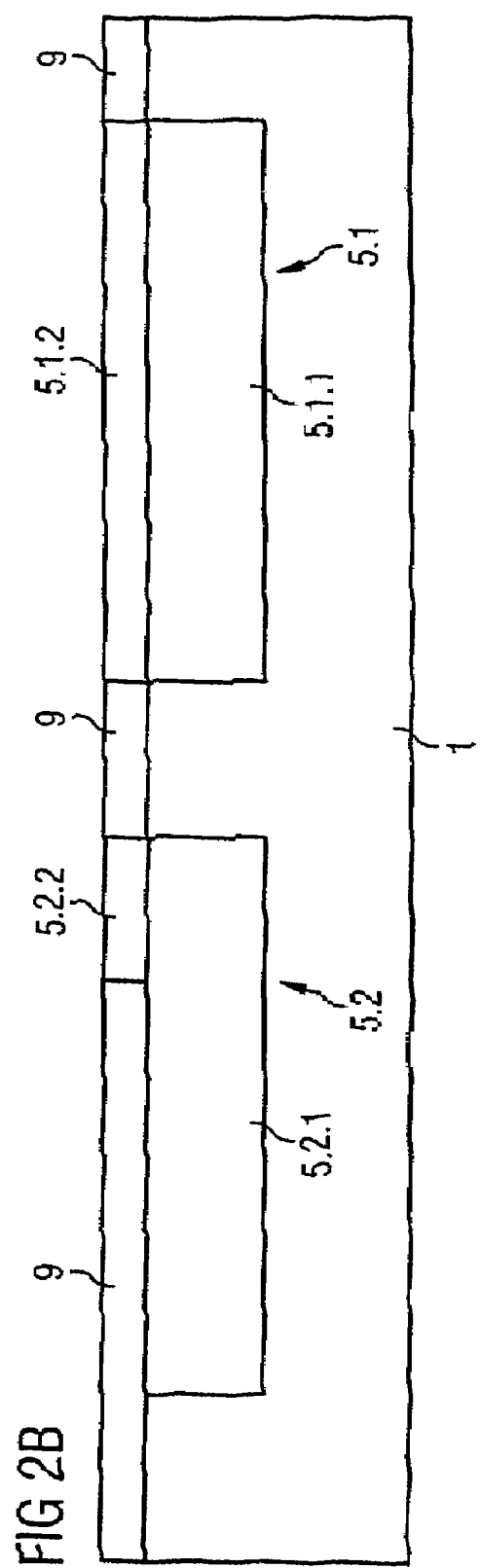

Afterward, in FIG. 2b, a second zone 5.1.2 of the buried layer 5.1 and a second zone 5.2.2 of the buried layer 5.2 are introduced into the epitaxial layer 9, these second zones $5.x.2$ also being $n^+$-doped. In this case, the second zone 5.1.2 extends approximately over the area of the first zone 5.1.1, whereas the second zone 5.2.2 of the buried layer 5.2 merely extends over a partial region of the first zone 5.2.1 of the buried layer 5.2.

Figure 2C:
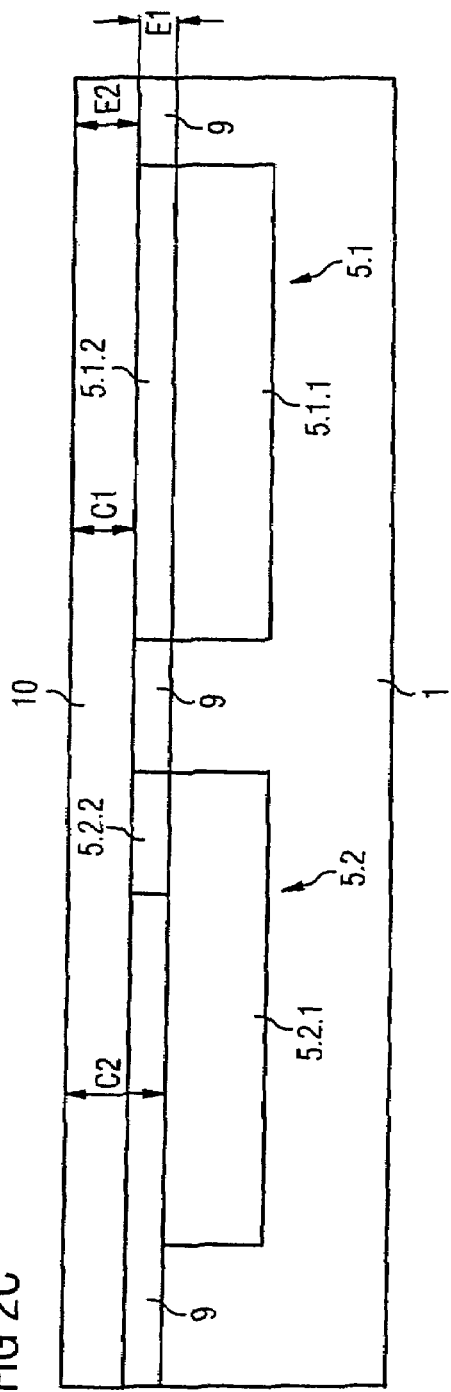

In the subsequent step of the method according to the invention in FIG. 2c, a second epitaxial layer 10 is deposited with a thickness E2 over the whole area of the epitaxial layer 9 and the second zones $5.x.2$ of the buried layers 5.1 and 5.2. In this case, said second epitaxial layer 10 may result from a single deposition or a plurality of depositions in succession. The collector width C1 of a first collector region may be defined by the thickness E2 of said epitaxial layer 10, the collector width C1 corresponding to the thickness E2 of the epitaxial layer 10. By contrast, the collector width C2 of the second collector region corresponds to the sum of the thicknesses E1 of the epitaxial layer 9 and the thickness E2 of the epitaxial layer 10.

Figure 2D:
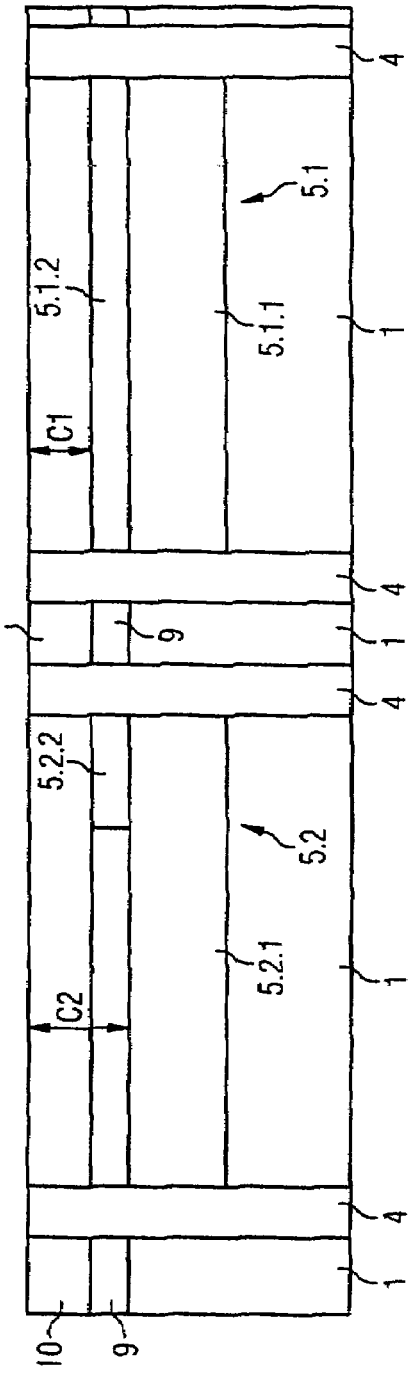

In FIG. 2d, the buried layers 5.1 and 5.2 are insulated from one another by means of insulation regions 4, embodied as deep trenches in the present example.

Afterward, in FIG. 2e, the STI oxide layer 13 is etched into the epitaxial layer 10 in accordance with FIG. 2d and preferably filled with STI oxide, regions for the collector terminal region 11 and also the first and second collector regions 2.1 and 2.2 being left free. The collector terminal regions 11 are then etched above the second zones 5.2.2 and 5.1.2 in order thereby to enable an electrical linking of the collector.

The first collector region 2.1 thus has a first collector width C1 and the second collector region has a larger collector width C2. The two collector regions 2.1 and 2.2 terminate in planar fashion with the surface of the STI oxide layer 13 and both have sharp junctions between the heavily doped regions of the buried layers $5.x$ and the more lightly doped collector regions $2.x$. As a result of this, the transistor structure acquires defined and exactly determinable properties.

A further method according to the invention for fabricating a transistor structure according to the invention with two collector regions having a different collector width is described in more detail with reference to FIGS. 3a to 3c.

In FIG. 3a, analogously to FIG. 1b, provision is made of a structure having a, preferably p-doped, semiconductor substrate 1, a first zone 5.1.1 of a first buried layer implanted into the semiconductor substrate 1, and an implanted second buried layer 5.2, having a thickness D2, insulation regions 4, a first auxiliary layer 6 and a second auxiliary layer 7, an STI oxide layer 13 and the collector zones 2.1.1 and 2.2.1.

As in FIG. 1b, in FIG. 3a, the auxiliary layers 6 and 7 are undercut under the STI oxide layer 13, so that the collector zones 2.1.1 and 2.2.1 have a stepped profile in cross section. By virtue of this undercut 14, the STI oxide layer 13 exhibits an overhang over part of the collector zones 2.1.1 and 2.2.1.

The thickness C3 of said collector zones 2.1.1 and 2.2.1 may vary between 5 nm and 300 nm.

After a masking layer 8 has been applied to the region of the collector zone 2.2.1, the collector zone 2.1.1, as shown using the arrows 15 in FIG. 3b, is doped in such a way that it has the same doping as the first zone 5.1.1 of the first buried layer 5.1. This is preferably an $n^+$-type doping. This newly formed second zone 5.1.2 and the first zone 5.1.1 now form the buried layer 5.1 having a thickness D1.

After the removal of the masking layer 8, in FIG. 3c, a first collector region 2.1 is deposited epitaxially on the first buried layer 5.1 with a collector width C1 and a further collector zone 2.2.2 having a thickness C4 is deposited epitaxially on the collector zone 2.2.1. The second collector region 2.2 is now formed from the two collector zones 2.2.1 and 2.2.2 and has a collector width C2 representing the sum of the thicknesses C3 and C4. Both collector regions 2.1 and 2.2 terminate in planar fashion with the surface of the STI oxide layer 13.

After the introduction of the collector terminal regions 11 and filling with tungsten, for example, the transistor structure of FIG. 3c is suitable for use in bipolar transistors.

In a further embodiment according to the invention as shown in FIG. 4, an insulating layer 3 is produced between the semiconductor substrate 1 and the buried layers 5.1 and 5.2.

The production of the collector regions 2.1 and 2.2 having different collector widths C1 and C2 and sharp junctions between the collector regions and the buried layers may correspond to the method according to the invention from FIGS. 3a to 3c. Moreover, the methods according to the invention which have been explained with reference to FIGS. 1a to 1d and 2a to 2e are also conceivable.

Preferably, in the methods according to the invention as shown in FIGS. 1 to 4, the first buried layer 5.1 and the second buried layer 5.2 are configured as an identical conductivity type. This configuration makes it possible to form two transistor structures of identical type one beside the other, that is to say for example two npn transistors or two pnp transistors.

In an alternative embodiment, the first buried layer 5.1 and the second buried layer 5.2 are configured as different conductivity types. This makes it possible to form an npn transistor beside a pnp transistor on the same semiconductor substrate 1.

In a particularly advantageous development of the methods according to the invention, the collector regions are formed with a dopant gradient, the concentration of the dopant varying in the horizontal direction. This development makes it possible, for example, to form an increased dopant concentration in the central collector region. This development, in particular with a small thickness of the collector region, reduces the base-collector space charge zone and thus reduces the collector transit time. This development is particularly advantageous primarily in the case of very small transistor structures in which the emitter region is arranged centered above the collector region.

It goes without saying that, instead of the deep trenches, it is also possible to use full trenches as insulation regions 4.

Overall, the methods according to the invention as explained with reference to FIGS. 1 to 4 make it possible to fabricate transistor structures having a first collector region 2.1, having a first collector width C1, and also a second collector region 2.2, having a larger collector width C2, on the same semiconductor substrate 1, all junctions between differently doped regions having a sharp interface. In this case, by way of example, the first collector region 2.1 is suitable for a high-frequency transistor with high limiting frequencies $f_T$ and the second collector region 2.2 is suitable for a high-voltage transistor with increased breakdown voltages.

The invention claimed is:

1. A method for fabricating a transistor structure comprising at least a first and a second bipolar transistor having different collector widths, the method comprising:
   A) providing a semiconductor substrate, and
   B) producing at least a first collector region of the first bipolar transistor having a first collector width and a second collector region of the second bipolar transistor having a second collector width,
   wherein
   a) at least a first zone of a first buried layer of a first conductivity type of the first bipolar transistor and a first zone of a second buried layer of a first or a second conductivity type of the second bipolar transistor are introduced into the semiconductor substrate,
   b) a first epitaxial layer is produced, which covers, over the whole area at least the first zones,
   c) at least a second zone of the first conductivity type is produced within the first epitaxial layer, the second zone adjoining the first zone of the first buried layer,
   d) a second epitaxial layer is produced, which covers, over the whole area, at least the first epitaxial layer and the second zone of the first buried layer,
   d) at least one insulation region is produced which isolates at least the collector regions from one another, and
   e) the second zone of the first buried layer adjoins the first collector region and the first zone of the second buried layer adjoins the second collector region.

2. A method for fabricating a transistor structure comprising at least a first and a second bipolar transistor having different collector widths, the method comprising:
   A) providing a semiconductor substrate,
   B) introducing at least a first buried layer of the first bipolar transistor and a second buried lever of the second bipolar transistor into the semiconductor substrate, and
   C) producing at least a first collector region having a first collector width on the first buried layer and a second collector region having a second collector width on the second buried layer,
   wherein
   a) for the production of the second collector width, a first collector zone having a first thickness is produced on the second buried layer,
   b) a second collector zone having a second thickness is produced on the first collector zone, c) at least one insulation region is produced which isolates at least the collector regions from one another; and wherein an insulating layer is produced between the semiconductor substrate and the buried layers.

3. A method for fabricating a transistor structure comprising at least a first and a second bipolar transistor having different collector widths, the method comprising:

A) providing a semiconductor substrate,

B) introducing at least a first buried layer of the first bipolar transistor and a second buried layer of the second bipolar transistor into the semiconductor substrate, and C) producing at least a first collector region having a first collector width on the first buried layer and a second collector region having a second collector width on the second buried layer, wherein a) for the production of the second collector width, a first collector zone having a first thickness is produced on the second buried layer, b) a second collector zone having a second thickness is produced on the first collector zone, c) at least one insulation region is produced which isolates at least the collector regions from one another; and wherein the insulation region is produced with the aid of shallow trench isolation technology.

4. The method as claimed in claim 1, wherein the second collector zone is deposited.

5. The method as claimed in claim 4, wherein the second collector zone is deposited epitaxially.

6. The method as claimed in claim 1, wherein an insulating layer is produced between the semiconductor substrate and the buried layers.

7. The method as claimed in claim 1, wherein the insulation region is produced with the aid of shallow trench isolation technology.

* * * * *

UNITED STATES PATENT AND TRADEMARK OFFICE
CERTIFICATE OF CORRECTION

PATENT NO. : 7,371,650 B2  Page 1 of 1
APPLICATION NO. : 10/532894
DATED : May 13, 2008
INVENTOR(S) : Josef Böck et al.

It is certified that error appears in the above-identified patent and that said Letters Patent is hereby corrected as shown below:

In the Claims

In column 8, claim 2, line 55, after "buried" delete "lever" and insert --layer-- in its place.

Signed and Sealed this

Seventeenth Day of February, 2009

JOHN DOLL
*Acting Director of the United States Patent and Trademark Office*